United States Patent
Hashimoto et al.

(10) Patent No.: US 6,994,414 B2
(45) Date of Patent: Feb. 7, 2006

(54) APPARATUS AND METHODS FOR FORMING FILM PATTERN

(75) Inventors: Takashi Hashimoto, Chino (JP); Masahiro Furusawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 94 days.

(21) Appl. No.: 10/275,000

(22) Filed: Oct. 22, 2002

(65) Prior Publication Data

US 2003/0083203 A1 May 1, 2003

(30) Foreign Application Priority Data

Oct. 22, 2001 (JP) ......................................... 2001-323701

(51) Int. Cl.
*B41J 29/393* (2006.01)

(52) U.S. Cl. ......................................................... 347/19
(58) Field of Classification Search ................... 347/19, 347/50, 51, 14, 12, 20, 23, 10, 5, 44, 43, 347/42, 41, 15, 47, 11, 57, 46, 9, 59; 73/865.9; 400/74

See application file for complete search history.

(56) References Cited

U.S. PATENT DOCUMENTS 5,132,248 A 7/1992 Drummond et al. ........ 505/325

6,260,938 B1 * 7/2001 Ohtsuka et al. ............... 347/15

FOREIGN PATENT DOCUMENTS

JP  A 59-75205  4/1984

* cited by examiner

Primary Examiner—Stephen Meier
Assistant Examiner—Charles Stewart, Jr.
(74) Attorney, Agent, or Firm—Oliff & Berridge, PLC

(57) ABSTRACT

The invention provides a method for forming a film pattern, in which a method for forming a film pattern by the ink-jet method is improved, an increase in film thickness is achieved efficiently with simple steps, a requirement for a decrease in line width is met and, in addition, problems such as breaks and short circuits are not brought about when a conductive film is made. The method can include a first discharging step, wherein droplets are discharged in the whole film formation region with a pitch larger than the diameter of the droplet after being hit onto the substrate. In the second discharging step, droplets are discharged at positions in the whole film formation region different from the discharge positions in the first discharging step with the same pitch as that in the first discharging step. In the third discharging step, droplets are discharged in the whole film formation region with a pitch smaller than the pitch in the first discharging step. The substrate is treated beforehand in order to have the contact angle of 60 degrees or more with respect to the droplets.

18 Claims, 13 Drawing Sheets

Fig. 10
(a)
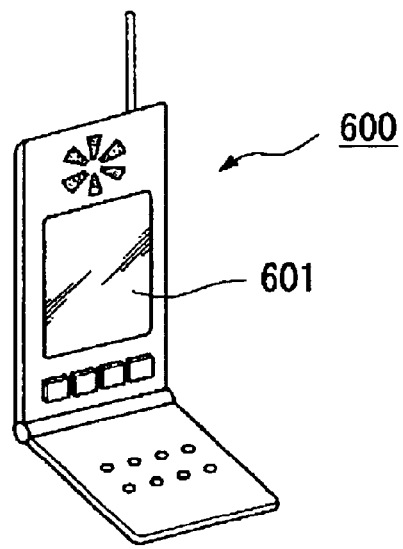
(b)
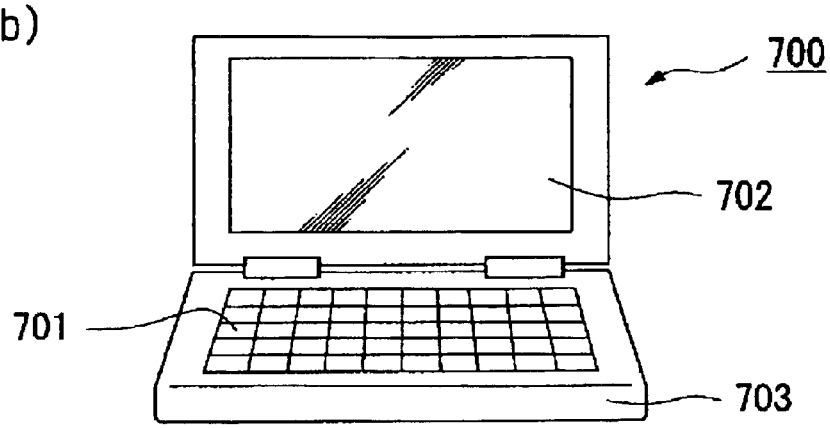
(c)
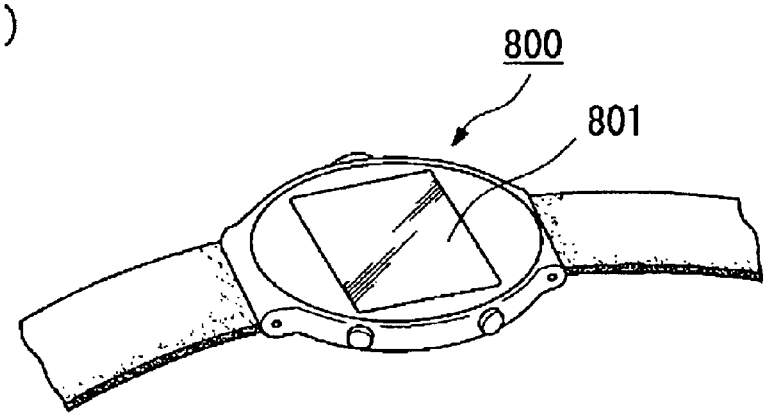

APPARATUS AND METHODS FOR FORMING FILM PATTERN

BACKGROUND OF THE INVENTION

1. Field of Invention

The present invention relates to a method for forming film patterns, such as a conductive film wiring and a silicon film pattern, used for such as wirings of electrodes, antennas, electronic circuits, and integrated circuits, and an apparatus for forming the same. The present invention also relates to a conductive film wiring, an electro-optical apparatus, electronic equipment, and a non-contact card medium.

2. Description of Related Art

Currently, lithography methods, for example, are used in the manufacture of wirings used for electronic circuits, integrated circuits, or the like. In such lithography methods, a coating of a photosensitive material referred to as resist is applied on a substrate coated beforehand with a conductive film, a circuit pattern is irradiated and is developed, the conductive film is etched in accordance with the resist pattern and, therefore, a wiring is formed. This lithography method requires large-scale equipment, such as a vacuum apparatus, and complicated steps. Therefore, the efficiency of use of the material is about several percentages, the most of the material have to be discarded, and the manufacturing cost can be expensive.

On the other hand, U.S. Pat. No. 5,132,248 describes a method in which a substrate can be directly pattern-coated by an ink-jet method with liquid containing conductive fine particles being dispersed and, thereafter, a heat treatment or laser irradiation has been performed to convert into a conductive pattern. Using this method, there are merits that the photolithography becomes unnecessary, the process becomes simple by a large degree and, in addition, the usage of raw materials is reduced.

However, it is required that conductive fine particles are overlapped each other to some extent and a thick film can be formed in order to use as a wiring. In other words, when the conductive fine particles are not overlapped, the portions where the conductive fine particles are not made contact with each other bring about breaks, etc. Furthermore, when increase in thickness is insufficient, electrical resistance is increased and, therefore, the conductivity of the wiring becomes inferior.

However, regarding the method in which the substrate is directly pattern-coated by the ink-jet method with the liquid containing conductive fine particles being dispersed, since the liquid containing conductive fine particles being dispersed is used, there is a limit of the quantity of the conductive fine particles that can be applied by coating through discharge of a fixed quantity of the liquid from the viewpoint of viscosity, etc., during discharge. On the other hand, when it is intended to discharge the liquid in large quantities at a time, it becomes difficult to control the position of formation of the wiring. In addition, the line width of the wiring becomes large contrary to requirements for integration of electronic circuits, etc.

Accordingly, in order to properly perform conductive film wiring by the ink-jet method, as disclosed in Japanese Unexamined Patent Application Publication No. 59-75205, a method is suggested, in which banks (partition walls) are installed on a substrate and, therefore, the positions of the droplets discharged are controlled. By using the banks, even when discharge is performed with somewhat large quantities of discharge, the droplets discharged onto the substrate remain between the banks and, therefore, it is possible to form a wiring having a line width about 30 $\mu$m with the positional precision about 1 $\mu$m. However, such a bank has to be formed using photolithography and, therefore, an increase in cost is brought about.

It has also been suggested that a liquid material be selectively discharged by an ink-jet method onto a lyophilic portion of a substrate on which patterns of a liquid-repellent portion and the lyophilic portion were formed beforehand. In this case, since the liquid containing conductive fine particles being dispersed is likely to remain in the lyophilic portion, it is possible to form the wiring without forming banks while the positional precision is maintained.

However, regarding this method, since a step of forming patterns of the lyophilic portion and the liquid-repellent portion by using a mask, etc., is required and, in addition, a step of providing alignment marks for precisely applying a coating on the lyophilic pattern is also required, the process becomes complicated.

In addition, since the discharge is performed onto the lyophilic portion and, the droplets spread, it becomes difficult to form a conductive film with an increased film thickness. Consequently, it is considered to increase the number of discharges in order to increase the film thickness. However, it becomes difficult to collect the liquid within the lyophilic portion unless the liquid-repellent property of the liquid-repellent portion with respect to the liquid is increased by a large degree. Furthermore, the line width of the wiring to be formed is limited to the width of the lyophilic portion of the substrate.

As a method which does not require formation of the bank nor formation of the patterns of the liquid-repellent portion and the lyophilic portion, a method has been suggested which controlled the contact angle of liquid containing conductive fine particles being dispersed and a substrate at 30 degrees or more, but 60 degrees or less (Japanese Patent Application No. 2001-193679). In this invention, it is made possible to reduce wetting and spreading of the liquid after being hit onto the substrate and to increase the film thickness by controlling the contact angle at 30 degrees or more and, in addition, it is prevented by controlling the contact angle at 60 degrees or less that a droplet hit onto the substrate coalesces with a droplet having been already existed on the substrate so as to generate a puddle (bulge) and bring about problems such as breaks and short circuits.

In order to further avoid generation of bulges, the inventors of the present invention also suggested in the invention that the intervals between discharges be controlled and, therefore, overlapping of discharged droplets with each other was specified to become 1 to 10% of the diameter of the droplet. Furthermore, it was also suggested that after the discharged liquid was dried, another coating be applied thereon. In this case, since the portion where the liquid has been dried is lyophilic, the discharged liquid later is likely to remain at the portion where the liquid has been dried and, therefore, it becomes possible to further increase the film thickness.

Herein, the relationship between the bulge and the break and short circuit will be described. FIG. 13 shows the condition that bulges B1, B2, and B3 have been generated at conductive film wirings A1 to A4. As shown in FIG. 13, the bulge B1 generated on the conductive film wiring A1 contacts the adjacent conductive film wiring A2 and, therefore, the conductive film wiring A1 and the conductive film wiring A2 are short-circuited at X1. Since the bulge B1 is generated by surrounding droplets being attracted, a break has occurred at X2 in the conductive film wiring A1.

As described above, generation of the bulge brings about a fatal defect in performance of the conductive film wiring.

However, although the method according to the Japanese Patent Application No. 2001-193679 prevented generation of the bulge, it did not exhibit an adequate effect of preventing the liquid containing conductive fine particles being dispersed from wetting and spreading after being hit onto the substrate because the liquid-repellent property of the substrate was 60 degrees or less and was not so large. Consequently, further improvements have been required in order to meet the needs for the increase in film thickness and the decrease in line width.

Furthermore, in the case where another coating was applied after the liquid was dried, since the liquid-repellent property of the substrate was 60 degrees or less and was not so large, difference in the liquid-repellent property from the portion which became lyophilic after the liquid was dried was not adequate. Consequently, when the quantity of the liquid was excessive in application of another coating, there were problems in that the liquid did not remain at the portion where the liquid had been dried previously, and was likely to flow down to the substrate and, therefore, the line width was increased.

Next, in general, formation of patterns of silicon thin films applied to integrated circuits and thin film transistors is performed by forming amorphous or polysilicon films on all over the substrate surfaces by a thermal CVD method, a plasma CVD method, a photo-assisted CVD method, etc., and thereafter, by removing unnecessary portions of the silicon films by photolithography.

However, regarding formation of the silicon thin film pattern by these CVD methods and the photolithography, further improvements have been expected with respect to the following points in terms of the process.

(1) Since a vapor phase reaction is used, particles of silicon are generated in the vapor phase and, therefore, production yield is low due to pollution of the apparatus and generation of foreign matters.
(2) Since the raw material is gaseous, a silicon thin film with a uniform thickness is unlikely to be produced on a substrate having convexities and concavities on the surface.
(3) Since the formation speed of the film is low, the productivity is low.
(4) In the plasma CVD method, complicated and expensive high-frequency generators, vacuum apparatuses, etc., are required.
(5) Regarding photolithography, the process is complicated, the efficiency of use of the raw material is low, and large quantities of wastes, such as resists and etchants are generated.

In terms of the material, since gaseous silicon hydride having high toxicity and high reactivity is used, it is difficult to handle and, in addition, a hermetically sealed vacuum apparatus is required because of the material being gaseous. In general, these apparatuses are large-scale, the apparatuses themselves are expensive and, in addition, high cost of the product is brought about because a great deal of energy is consumed for a vacuum system and a plasma system.

On the other hand, a method for forming a silicon film pattern by simple steps with high precision has also been suggested, in which a coating of liquid containing an organic silicon compound has been selectively applied to only a lyophilic portion on a substrate on which patterns of a liquid-repellent portion and the lyophilic portion were formed beforehand by an ink-jet method and, thereafter, the liquid has been converted into a silicon film pattern by a heat treatment, etc.

However, regarding this method, since a step of forming patterns of the lyophilic portion and the liquid-repellent portion by using a mask, etc., is required and, in addition, a step of providing alignment marks for precisely applying a coating on the lyophilic pattern is also required, the process becomes complicated.

In addition, although the silicon film pattern is required to also have a somewhat large film thickness in order to keep the uniformity of the film, since the discharge is performed onto the lyophilic portion, the droplets spread by wetting and, therefore, it becomes difficult to increase the film thickness. Consequently, it is considered to increase the number of discharges in order to increase the film thickness. However, it becomes difficult to collect the liquid within the lyophilic portion unless the liquid-repellent property of the liquid-repellent portion with respect to the liquid is increased by a large degree. The width of the silicon film pattern formed is limited to the width of the lyophilic portion of the substrate.

SUMMARY OF THE INVENTION

The present invention was made in consideration of the circumstances, and an object is to provide a method for forming a film pattern, in which a method for forming a film pattern by the ink-jet method is improved, an increase in film thickness is achieved efficiently with simple steps, a requirement for a decrease in line width is met, and problems such as breaks and short circuits are not brought about when a conductive film is made, and an apparatus for forming the same.

It is also an object to provide a fine, thick conductive film wiring, which provides advantages with respect to the electrical conduction and is unlikely to bring about problems such as breaks and short circuits.

Furthermore, it is also an object to provide an electro-optical apparatus in which problems such as breaks and short circuits in the wiring, are unlikely to bring about and, in addition, which can be miniaturized and slimmed, and electronic device and a non-contact card medium using the same.

A method for forming a film pattern according to the present invention forms a film pattern by discharging droplets composed of liquid containing a component for forming a film in a predetermined film formation region on a substrate. The method for forming a film pattern can include a first discharging step of discharging a plurality of droplets in the whole film formation region with a pitch larger than the diameter of the droplet after being hit onto the substrate, and a second discharging step of discharging a plurality of droplets at positions in the whole film formation region different from the discharge positions in the first discharging step with a pitch larger than the diameter of the droplet after being hit onto the substrate.

Herein, film formation region can refer to a region in which a film pattern should be formed, and is primarily composed of a single or a plurality of straight lines. The whole film formation region does not refer to the overall surface of the film formation region. It refers only to a specific region of the film formation region, such as the right half of the straight line, which is drawn from side to side.

The diameter of the droplet after being hit onto the substrate can refer to the maximum diameter while the discharged droplet spreads naturally after being hit onto the substrate and shrinks accompanying drying. That is, it refers to discharge in such a manner that by discharging with a pitch larger than the diameter of the droplet after being hit onto the substrate, even when succeedingly discharged droplet naturally spreads after being hit onto the substrate, they are at a distance from each other and are not made contact with each other.

Different position can refer to that positions of the center of the droplets are different and, therefore, the droplet discharged by the first step and the droplet discharged by the second step partially overlaps each other or do not overlap at all.

According to the present invention, in both of the first discharging step and second discharging step, one droplet and another droplet are discharged at a distance from each other in the film formation region on the substrate. Consequently, droplets do not coalesce with each other and, therefore, no bulge is generated.

Since the discharge positions are different between the first and second discharging steps, gaps between the droplets by the first discharging step can be bridged by the second discharging step.

The droplet discharged in the second discharging step may overlap the droplet discharged in the first discharging step. This is because since drying of the droplet discharged in the first discharging step is in the stage advanced to some extent or has been completed, the risk of generation of the bulge due to mutual coalescence of the droplets of both steps is reduced in comparison with that in the case where droplets which overlap each other are succeedingly discharged in the same step.

According to the present invention, since the risk of generation of the bulge is reduced, the liquid-repellent property of the substrate can be increased and, therefore, the contact angle of the substrate and the liquid can be increased. Consequently, it becomes possible to decrease the line width and to increase the film thickness.

Since the inkjet method is used, the film can be formed even when the substrate is not flat and has concavities and convexities. Consequently, for example, the film of wiring can also be formed straddling uneven portions.

In the present invention, preferably, the pitch in the second discharging step is nearly the same as the pitch in the first discharging step. According to this, steps can be simplified, and the operation efficiency can be improved. However, it is not absolutely essential that the pitch in the second discharging step is specified to be nearly the same as the pitch in the first discharging step. For example, the pitch in the second discharging step can also be approximately one-half or twice that of the pitch in the first discharging step.

In the present invention, preferably, the pitch in the first discharging step is equivalent to or less than twice the diameter of the droplet after being hit onto the substrate. In this case, since a continuous linear film pattern can be formed only by the first and second discharging steps, the steps can be simplified, and the operation efficiency can be improved.

When the pitch in the first discharging step exceeds twice the diameter of the droplet after being hit onto the substrate, the continuous linear film pattern can be formed by performing the discharge step at least one more time.

In the present invention, preferably, the pitch in the first discharging step is larger than the diameter of the droplet after being hit onto the substrate by 10 $\mu$m or more. According to this, even when the error in the position where the droplets hit is taken into consideration, it can be performed with reliability to discharge in a manner that succeedingly discharged droplets are at a distance from each other and are not made contact with each other.

In the present invention, preferably, the third discharging step of discharging a plurality of droplets of the liquid in the whole film formation region with a pitch smaller than the pitch in the first discharging step after the second discharging step is included.

The portion where the droplets discharged by the first and second discharging steps have been dried completely or to some extent has been imparted with lyophilic property and, therefore, the discharged liquid by the third discharging step is likely to integrate with the previous liquid. Consequently, according to the present invention, it becomes easy to make the droplet discharged by the third discharging step remain in the film formation region. Therefore, it becomes possible to discharge while the pitch in the third discharging step is smaller than the pitch in the first discharging step, and it becomes possible to efficiently increase the film thickness.

In particular, the pitch in the third discharging step is preferably equivalent to or less than the diameter of the droplet after being hit onto the substrate. That is, preferably, the pitch is specified in order that the droplets in the third discharging step contact each other after being hit. According to this, it becomes possible to efficiently advance the increase in the film thickness.

The third discharging step is preferably performed after the droplets by the first and second discharging steps are dried as much as possible, although it is unnecessary to wait until drying is completed. This is because even when drying is not completed, but is in the stage advanced to some extent, the risk of generation of the bulge due to mutual coalescence of the droplets of different discharging steps is reduced in comparison with that in the case where droplets which overlap each other are succeedingly discharged in the same step.

Preferably, the third discharging step is performed after a continuous linear film pattern is formed by the first and second discharging steps or by at least one more discharging step after the first and second discharging steps. According to this, it becomes easier to make the droplet discharged by the third discharging step remain in the film formation region.

Preferably, the third discharging step is performed not once, but a number of times. According to this, further increase in the film thickness can be achieved.

In the present invention, the contact angle of the substrate and the liquid is preferably 60 degrees or more. According to this, droplets that are hit onto the substrate are not spread in the first and second discharging steps. In the third discharging step, the difference in lyophilic property between the lyophilic property of the portion where the droplets discharged by the first and second discharging steps have been dried completely or to some extent and the liquid-repellent property of the substrate becomes large and, therefore, it becomes easier to make the droplet discharged by the third discharging step remain in the film formation region. Consequently, it becomes possible to decrease the line width and to increase the film thickness.

The contact angle is more preferably 90 degrees or more. According to this, it becomes possible to further decrease the line width and to further increase the film thickness. The upper limit of the contact angle is preferably 110 degrees.

This is because when the contact angle exceeds 110 degrees, the droplet discharged may not follow in a hitting trajectory, but instead move onto the substrate.

In the present invention, preferably, the substrate is surface-treated in order to have the contact angle of 60 degrees or more with respect to the liquid in advance of the first discharging step.

According to this, wetting and spreading of the droplets hit can be prevented in the first and second discharging steps. In the third discharging step, the difference in lyophilic property between the lyophilic property of the portion where the droplets discharged by the first and second discharging steps have been dried completely or to some extent and the liquid-repellent property of the substrate becomes large and, therefore, it becomes easier to make the droplet discharged by the third discharging step stay in the film formation region. Consequently, it becomes possible to decrease the line width and to increase the film thickness.

The contact angle is more preferably 90 degrees or more. According to this, it becomes possible to further decrease the line width and to further increase the film thickness. The upper limit of the contact angle is preferably 110 degrees. This is because when the contact angle exceeds 110 degrees, the droplet discharged may not stay in a hitting trajectory, but move on the substrate.

Since the contact angle is determined based on the mutual relationship between the substrate side and the liquid side, it also depends on properties of the liquid side. However, regarding the properties of the discharged liquid by the ink-jet method, due to limitations such as surface tension and viscosity, it is practically difficult to adjust the contact angle by adjusting only the properties of the liquid. Consequently, it is appropriate to adjust the contact angle by the surface treatment of the substrate side.

The present invention can be applied to the component for forming a film that contains conductive fine particles. According to the present invention, a fine, thick conductive film wiring, which provides advantages with respect to the electrical conduction and is unlikely to bring about problems such as breaks and short circuits.

In this case, preferably, the step of converting the component for forming a film into a conductive film by a heat treatment or an optical treatment is included. According to this, the electrical conductivity of the conductive fine particle is exhibited and, therefore, a film having the electrical conductivity can be produced. This heat treatment or optical treatment may be performed every time after individual discharging steps, or be performed collectively in one operation after all discharging steps are completed.

The present invention can also be used suitably for formation of a silicon film pattern, formation of an insulation film pattern of polyimide, etc., formation of a resist film pattern and the like.

An apparatus for forming a film pattern according to the present invention forms the film pattern by discharging liquid containing a component for forming a film in a predetermined film formation region on a substrate by an ink-jet method, wherein the film pattern is formed by the method for forming a film pattern according to any one of the inventions.

According to the present invention, an apparatus for forming a film pattern can be produced in which an increase in film thickness is achieved efficiently with simple steps, a requirement for a decrease in the line width is met, and problems, such as breaks and short circuits, are not brought about when a conductive film is made.

The present invention can be applied suitably when the component for forming a film that contains conductive fine particles. According to the present invention, a fine, thick conductive film wiring, which provides advantages with respect to the electrical conduction and is unlikely to bring about problems such as breaks and short circuits.

In this case, preferably, a heat treatment device or an optical treatment device for converting the component for forming a film into a conductive film is provided. According to this, the electrical conductivity of the conductive fine particle is exhibited and, therefore, a film having the electrical conductivity can be produced.

A conductive film wiring of the present invention is formed by the method for forming a film pattern according to any one of the inventions.

According to the present invention, a fine, thick conductive film wiring, which provides advantages with respect to the electrical conduction and is unlikely to bring about problems, such as breaks and short circuits.

An electro-optical apparatus of the present invention can be provided with the conductive film wiring according to the invention. Examples of electro-optical apparatuses of the present invention can include such as a liquid crystal display device, an organic electroluminescent display device, and a plasma display device.

Electronic device according to the present invention is provided with the electro-optical apparatus according to the present invention.

A non-contact card medium of the present invention can be provided with the conductive film wiring according to the invention as an antenna circuit.

According to these inventions, an electro-optical apparatus can be provided, in which problems such as breaks and short circuits in the wiring portions and the antenna, are unlikely to bring about and, in addition, which can be miniaturized and slimmed, and electronic device and a non-contact card medium using the electro-optical apparatus can be provided.

BRIEF DESCRIPTION OF THE DRAWINGS

The present invention will be described with reference to the accompanying drawings, wherein like numerals reference like elements, and wherein:

FIGS. 10a–c show electronic devices according to the sixth embodiment, (a) is a diagram showing an example of a cellular phone provided with the liquid crystal device of the fourth embodiment, (b) is a diagram showing an example of portable information processing device provided with the liquid crystal device of the fourth embodiment, and (c) is a diagram showing an example of wristwatch type electronic device provided with the liquid crystal device of the fourth embodiment;

FIG. 12 is a graph showing the relationship between the contact angle and the increase in line width.

DETAILED DESCRIPTION OF PREFERRED EMBODIMENTS

Figure 1:
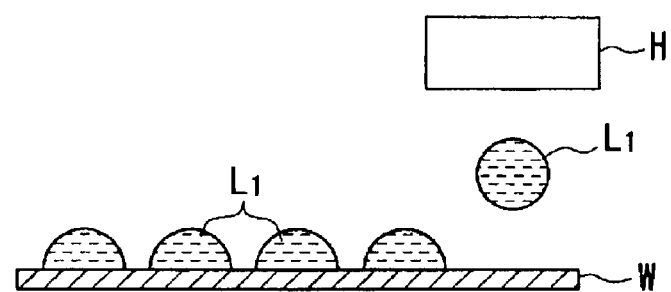
FIG. 1 is a process diagram of the method for forming a film pattern according to the first embodiment.

The embodiments according to the present invention will be described below in detail.

As the first embodiment, a method for forming a wiring, which is an example of the method for forming a film pattern of the present invention, will be described. The method for forming a wiring according to the present embodiment is composed of a surface treatment step, a discharging step, and a heat treatment/optical treatment step. Among them, the discharging step is composed of a dispersion preparation step, the first discharging step, the second discharging step, and the third discharging step. Each step will be described below.

Various materials, such as Si wafers, quartz glass, glass, plastic films, and metal plates, can be used as a substrate on which a conductive film wiring is to be formed. Those in which semiconductor films, metal films, dielectric films, organic films, and the like, are formed as substrate layers on the surfaces of these various material substrates may be used as the substrate on which the conductive film wiring is to be formed.

The surface of this substrate on which the conductive film wiring is to be formed is subjected to a surface treatment in order that a predetermined contact angle with respect to the liquid containing conductive fine particles becomes 60 degrees or more, preferably 90 degrees or more, but 110 degrees or less.

In order to control the liquid-repellent property (wettability) of the surface as described above, various surface treatment methods as described below can be adopted.

As one of the methods for surface treatment, a method for forming a self-organizing film made of an organic molecular film, etc., on the surface of the substrate, on which a conductive film wiring is to be formed, is mentioned.

The organic molecular film for treating the substrate surface is provided with a functional group capable of bonding to the substrate, a functional group, such as a lyophilic group, a liquid-repellent group, which modifies a surface property (control surface energy) of the substrate on the side opposite thereto, and a carbon straight chain or a partially branched carbon chain for bonding these functional groups, and bonds to the substrate so as to form a molecular film such as a monomolecular layer, by self-organizing.

The self-organizing film is composed of bonding functional groups capable of reacting with atoms constituting a substrate layer such as a substrate and the other straight-chain molecules, and is a film formed by orientating compounds having extremely high orientation property because of interaction of the straight-chain molecules. Since this self-organizing film is formed by monomolecular orientation, the film thickness can be reduced by a large degree and, in addition, a film with uniformity of a molecular level is produced. That is, since identical molecules locate on the surface of the film, uniform and excellent liquid-repellent property or lyophilic property can be imparted to the surface of the film.

When fluoroalkylsilane, for example, is used as the compound having a high orientation property, since a self-organizing film is formed while each compound is orientated in order that a fluoroalkyl group locates on the surface of the film, uniform liquid-repellent property is imparted to the surface of the film.

Examples of compounds which form such a self-organizing film include fluoroalkylsilanes (hereafter referred to as "FAS"), for example, heptadecafluoro-1,1,2,2tetrahydrodecyltriethoxysilane, heptadecafluoro-1,1,2,2tetrahydrodecyltrimethoxysilane, heptadecafluoro-1,1,2,2tetrahydrodecyltrichrolosilane, tridecafluoro-1,1,2,2tetrahydrooctyltriethoxysilane, tridecafluoro-1,1,2,2tetrahydrooctyltrimethoxysilane, tridecafluoro-1,1,2,2tetrahydrooctyltrichrolosilane, and trifluoropropyltrimethoxysilane. At the time of use, although it is preferable to use one compound alone, combined use of at least two compounds is not restricted as long as the predetermined objects of the present invention are carried out. In the present invention, preferably, the FAS is used as the compound which forms the self-organizing film from the viewpoint of adhesion to the substrate and impartation of excellent liquid-repellent property.

In general, FAS is represented by a structural formula $RnSiX_{(4-n)}$. Herein, n denotes an integer of 1 or more, but 3 or less, and X denotes a hydrolyzable group such as a methoxy group, an ethoxy group, and a halogen atom. R denotes a fluoroalkyl group, has a structure of $(CF_3)(CF_2)_x(CH_2)_y$ (where x denotes an integer of 0 or more, but 10 or less, and y denotes an integer of 0 or more, but 4 or less), and when a plurality of R or X bond to Si, all of the R or X groups may be the same or different. The hydrolyzable group denoted by X forms silanol by hydrolysis, reacts with a hydroxyl group of the ground, such as a substrate (glass, silicon), and therefore, bonds to the substrate with a siloxane bond. On the other hand, R has a fluoro-group such as $(CF_3)$, on the surface and therefore, modifies the surface of the ground such as the substrate, into a surface which is not wetted (surface energy is low).

The self-organizing film made of the organic molecular film, etc., is formed on the substrate by putting the material compound and the substrate in the same sealed container, and by leaving for about 2 to 3 days when at room temperature. It is formed on the substrate by keeping the whole sealed container at 100° C. for about 3 hours. Although a method for forming from a vapor phase is described above, the self-organizing film can also be formed from a liquid phase. For example, the self-organizing film can be formed on a substrate by immersing the substrate in a solution containing a material compound, and by performing cleaning and drying.

It is desirable to perform a pretreatment, such as irradiation of ultraviolet light to the substrate surface and cleaning with a solvent, before formation of the self-organizing film.

Examples of other methods for surface treatment include a method of irradiating plasma at atmospheric pressure or in a vacuum. The sort of gas used for the plasma treatment can be variously selected in consideration of the surface material of the substrate, on which the conductive film wiring is to be formed, and the like.

For example, tetrafluoromethane, perfluorohexane, perfluorodecane, and the like, can be used as a treatment gas.

The surface treatment can also be performed by applying a film having the desired liquid-repellent property such as a polyimide film, which has been subjected to tetrafluoroethylene processing, on the substrate surface. The polyimide film may be used as a substrate with no further treatment.

When the substrate surface has a liquid-repellent property higher than the desired liquid-repellent property, examples of methods for making it lyophilic include a method of irradiating ultraviolet light of 170 to 400 nm and a method of exposing the substrate to an atmosphere of ozone.

Next, liquid containing conductive fine particles, which is discharged onto the substrate after the surface treatment, will be described.

As the liquid containing conductive fine particles, a dispersion in which conductive fine particles are dispersed in a dispersion medium is used. As the conductive fine particles used here, metal fine particles containing any one of gold, silver, copper, palladium, and nickel, and such as fine particles of a conductive polymer and superconductor are used.

These conductive fine particles can also be used after the surface is coated with an organic material, etc., in order to improve the dispersiveness. Examples of coating materials to be applied on the surfaces of the conductive fine particles by coating include such as organic solvents, xylene, toluene, and citric acid.

The particle diameter of the conductive fine particle is preferably 5 nm or more, but 0.1 $\mu$m or less. This is because when exceeding 0.1 $\mu$m clogging of a nozzle is likely to occur and, therefore, discharge by the ink-jet method becomes difficult. In addition, this is because when less than 5 nm, the volume ratio of the coating agent with respect to the conductive fine particles is increased and, therefore, the ratio of the organic materials in the resulting film becomes excessive.

Those having a vapor pressure of 0.001 mmHg or more, but 200 mmHg or less (about 0.133 Pa or more, but 26,600 Pa or less) at room temperature are preferable as the dispersion medium for the liquid containing the conductive fine particles. This is because when the vapor pressure is higher than 200 mmHg, the dispersion medium vaporizes rapidly after being discharged and, therefore, it becomes difficult to form an excellent film.

The vapor pressure of the dispersion medium is more preferably 0.001 mmHg or more, but 50 mmHg or less (about 0.133 Pa or more, but 6,650 Pa or less). This is because when the vapor pressure is higher than 50 mmHg, clogging of a nozzle due to drying is likely to occur during discharge of the droplets by the ink-jet method and, therefore, it becomes difficult to discharge stably.

On the other hand, when the dispersion medium has a vapor pressure of lower than 0.001 mmHg at room temperature, drying becomes slow so that the dispersion medium becomes likely to remain in the film and, therefore, a good-quality conductive film is unlikely to be produced after a heat and/or optical treatment in the later step.

The dispersion medium is not specifically limited as long as the medium can disperse the conductive fine particles and does not agglomerate, and includes as follows: water; alcohols such as methanol, ethanol, propanol, and butanol; hydrocarbon-based compounds such as n-heptane, n-octane, decane, toluene, xylene, cymene, durene, indene, dipentene, tetrahydronaphthalene, decahydronaphthalene, and cyclohexylbenzene; ether-based compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl) ether, and p-dioxane; polar compounds such as propylene carbonate, $\gamma$-butyrolactone, N-methyl-2-pyrrolidone, dimethylformamide, dimethyl sulfoxide, and cyclohexanone. Among these, water, alcohols, hydrocarbon-based compounds, and ether-based compounds are preferable from the viewpoint of the dispersiveness of the fine particles, the stability of the dispersion, and the easiness in application to the ink-jet method, and examples of more preferable dispersion media can include water and hydrocarbon-based compounds. These dispersion media can be used alone or as a mixture of at least two sorts.

When the conductive fine particles are dispersed in the dispersion medium, the dispersoid concentration is 1% by mass or more, but 80% by mass or less, and can be adjusted in accordance with the desired film thickness of the conductive film. When the dispersoid concentration exceeds 80% by mass, agglomeration becomes likely to occur and, therefore, a uniform film is unlikely to be produced.

The surface tension of the dispersion of the conductive fine particles is preferably within the range of 0.02 N/m or more, but 0.07 N/m or less. This is because when the surface tension is less than 0.02 N/m during discharge of the liquid by the ink-jet method, the wettability of an ink composition with respect to a nozzle surface is increased and, therefore, a deviation in flight is likely to occur, and when the surface tension exceeds 0.07 N/m, the shape of meniscus at the nozzle tip is not stabilized and, therefore, it becomes difficult to control the quantity of discharge and timing of discharge.

In order to adjust the surface tension, a very small quantity of surface tension regulator of fluorine-based, silicone-based, nonionic, or the like can be added to the dispersion within the range in which the contact angle with the substrate is not excessively reduced. The nonionic surface tension regulator improves the wettability of the liquid with respect to the substrate, improves the leveling property of the film, and is useful in prevention of occurrence of graininess in the coating film, occurrence of orange peels, etc.

The dispersion may contain organic compounds, for example, alcohols, ethers, esters, and ketones, if necessary.

The viscosity of the dispersion is preferably 1 mPa·s or more, but 50 mPa·s or less. This is because when the viscosity is less than 1 mPa·s during discharge by the ink-jet method, the periphery of the nozzle is likely to be polluted due to bleeding of ink, and when the viscosity exceeds 50 mPa·s, the frequency of clogging of a nozzle hole is increased and, therefore, it becomes difficult to discharge droplets smoothly.

In the present embodiment, the case where the wiring formation region is a straight line will be described. Droplets $L_1$ of the dispersion are discharged from an ink-jet head H, and are dropped in the wiring formation region on a substrate W. As shown in FIG. 1, the droplet $L_1$ is discharged with a pitch larger than the diameter of the droplet $L_1$ after being hit onto the substrate W. That is, discharge is performed at a certain interval in order that the droplets $L_1$ are not made contact with each other on the substrate W.

After the droplets $L_1$ are discharged in the whole wiring formation region, a drying treatment is performed, if necessary, in order to remove the dispersion medium. The drying treatment can be performed by a treatment with, for example, a common hot plate and an electric furnace which heat the substrate W and, in addition to them, by lamp annealing. The light source of the light used for the lamp annealing is not specifically limited and includes infrared lamps, xenon lamps, YAG lasers, argon lasers, carbon dioxide gas lasers, and excimer lasers such as XeF, XeCl, XeBr, KrF, KrCl, ArF, ArCl. In general, regarding these light sources, those having an output within the range of 10 W or more, but 5,000 W or less are used. However, the range of 100 W or more, but 1,000 W or less is adequate for the present embodiment.

At this time, the degree of heating or light irradiation may be increased to the extent that not only the dispersion medium is removed, but also the dispersion is converted into a conductive film. However, the conversion of the conductive film may be performed collectively in the heat treatment/optical treatment after all discharging steps are completed and, therefore, it is adequate for the first discharging step that the dispersion medium can be removed to some extent. Consequently, in the case of the heat treatment, usually, it is adequate that heating is performed at about 100° C. for several minutes.

The drying treatment can be performed while droplets are discharged. For example, drying can be made to proceed immediately after being hit onto the substrate by discharging onto a heated substrate W, or by cooling the ink-jet head H and using a dispersion medium having a low boiling point.

Figure 2:
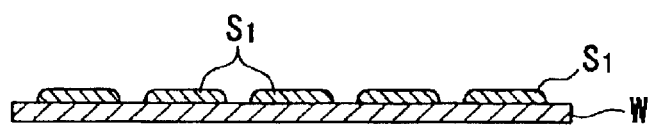
FIG. 2 is a process diagram of the method for forming a film pattern according to the first embodiment.

After drying, the droplet $L_1$ becomes a dry film $S_1$. As shown in FIG. 2, the volume of the dry film $S_1$ has been reduced remarkably because of removal of the dispersion medium, the viscosity has been increased and, therefore, it has become easy to fix at a predetermined position in the wiring formation region.

Figure 3:
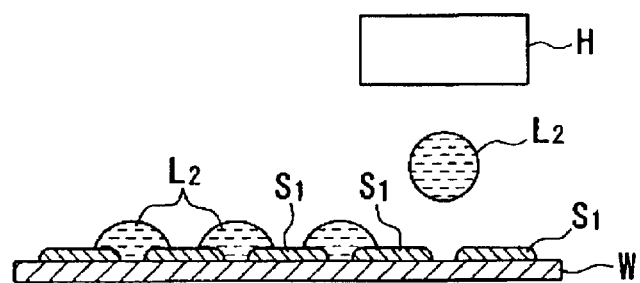
FIG. 3 is a process diagram of the method for forming a film pattern according to the first embodiment.

Subsequently, droplets $L_2$ of the dispersion are discharged from the ink-jet head H, and are dropped in the wiring formation region on the substrate W. The droplet $L_2$ is a droplet of the same dispersion as that of the droplet $L_1$, and the volume is also the same. As shown in FIG. 3, the droplet $L_2$ is dropped nearly at the center between the droplet $L_1$ and the droplet $L_1$. That is, the pitches of the droplet $L_2$ and the droplet $L_1$ are the same, and the droplet $L_2$ is also discharged with a pitch larger than the diameter after being hit onto the substrate W. Consequently, the droplets $L_2$ become in no contact with each other on the substrate W as well.

At this time, although the droplet $L_2$ and the dry film $S_1$ are made contact with each other, since the dispersion medium has already been removed completely or to some extent from the dry film $S_1$, no bulge is brought about due to mutual attraction of the two.

In FIG. 3, the start position of dropping of the droplet $L_2$ is the left side in the drawing in a manner similar to that of the droplet $L_1$. However, dropping may be started from the reverse direction (the right side in the drawing). In this case, the first and second discharging steps can be performed back and forth with respect to relative movement of the ink-jet head H and the substrate W.

After the droplets $L_2$ are discharged in the whole wiring formation region, a drying treatment is performed in a manner similar to that in the first discharging step, if necessary, in order to remove the dispersion medium. In this case, likewise, the degree of heating or light irradiation may be increased to the extent not only the dispersion medium is removed, but also the dispersion is converted into a conductive film. However, it is adequate that the dispersion medium can be removed to some extent. The drying treatment can be performed while droplets are discharged in a manner similar to that in the first discharging step.

Figure 4:
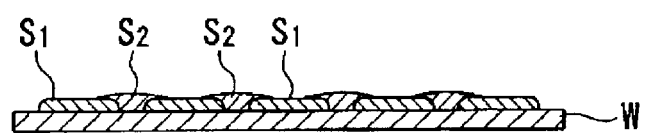
FIG. 4 is a process diagram of the method for forming a film pattern according to the first embodiment.

After drying, the droplet $L_2$ becomes a dry film $S_2$. As shown in FIG. 4, the volume of the dry film $S_2$ has been reduced remarkably because of removal of the dispersion medium, the viscosity has been increased and, therefore, it has become easy to fix at a predetermined position in the wiring formation region.

According to this, a linear dry film pattern is formed, in which the dry film $S_1$ and the dry film $S_2$ are joined continuously.

Herein, discharge positions in the first and second discharging steps will be described in further detail with reference to a plan view shown in FIG. 5.

Figure 5:
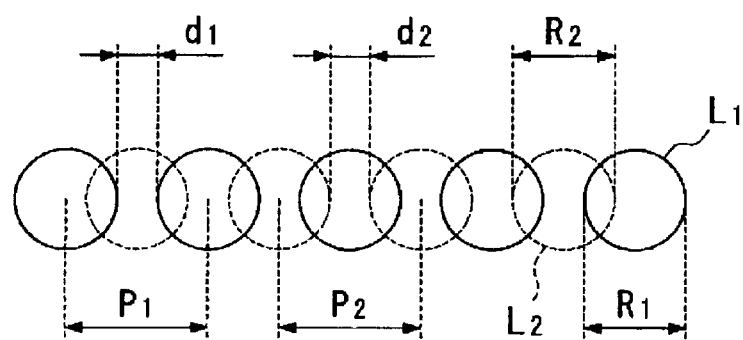
FIG. 5 is an explanation diagram of the method for forming a film pattern according to the first embodiment.

As shown in FIG. 5, the pitch $P_1$ of the droplets $L_1$ is larger than the diameter $R_1$ of the droplet $L_1$ after being hit onto the substrate W, and the droplets $L_1$ are discharged at an interval of $d_1$ ($d_1=P_1-R_1$). The pitch $P_2$ of the droplets $L_2$ is larger than the diameter $R_2$ of the droplet $L_2$ after being hit onto the substrate W, and the droplets $L_2$ are discharged at an interval of $d_2$ ($d_2=P_2-R_2$). Herein, the volumes of the droplet $L_1$ and the droplet $L_2$ are specified to be nearly the same and, therefore, there is a relationship of nearly $R_1=R_2$. However, in the second discharging step, since the lyophilic property on the dry film $S_1$ increases in comparison with that on the substrate W, $R_2$ becomes somewhat larger in the length direction in comparison with $R_1$. The pitch $P_1$ and the pitch $P_2$ are specified to be the same and, therefore, there is a relationship of nearly $d_1=d_2$. Since $R_2$ is somewhat larger in the length direction in comparison with $R_1$, $d_2$ is somewhat smaller in comparison with $d_1$.

Preferably, $d_1$ is specified to be 10 μm or more. According to this, even taking into consideration of the error in the position where the droplets hit and $R_2$ that is somewhat larger d, droplets are discharged succeedingly at a distance from each other and are not made contact with each other.

Figure 6:
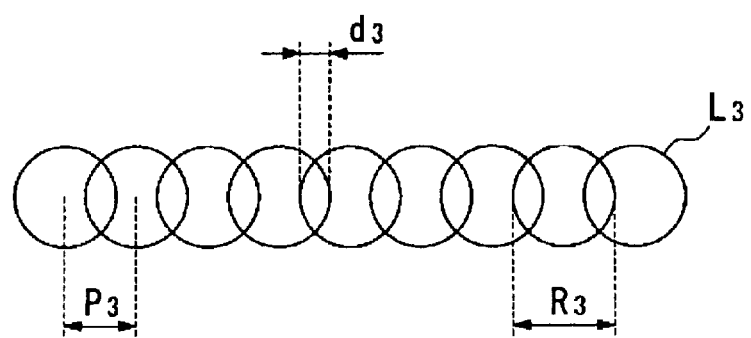
FIG. 6 is an explanation diagram of the method for forming a film pattern according to the first embodiment.

Subsequently, droplets $L_3$ of the dispersion are discharged from the ink-jet head H, and are dropped on the dry film $S_1$ and the dry film $S_2$ in the wiring formation region on the substrate W. The droplet $L_3$ is also a droplet of the same dispersion as that of the droplet $L_1$ and the droplet $L_2$, and the volume is also the same. As shown in FIG. 6, the pitch $P_3$ of the droplets $L_3$ is smaller than the pitch $P_1$ and the pitch $P_2$, and is smaller than the diameter $R_3$ of the droplet $L_3$ after being hit onto the substrate W. Consequently, the droplets $L_3$ overlap each other on the substrate W.

At this time, although the substrate W, onto which the droplets $L_3$ hit, is made contact with the dry film $S_1$ and the dry film $S_2$, since the dispersion medium has already been removed completely or to some extent from the dry film $S_1$ and the dry film $S_2$, no bulge is brought about due to mutual attraction of both of these dry films and the droplet $L_3$.

Although the droplets $L_3$ overlap each other, since the wiring formation region has been made to be lyophilic by the dry film $S_1$ and the dry film $S_2$, the droplets $L_3$ do not deviate out of the wiring formation region and, therefore, do not flow outside the wiring formation region treated to have a contact angle of 60 degrees or more, and preferably, 90 degrees or more. Consequently, the droplets $L_3$ are likely to remain in the wiring formation region, no bulge is brought about due to mutual attraction, and the line width is not increased.

The overlap $d_3$ of the droplet $L_3$ and the droplet $L_3$ is preferably specified to be 20 to 50% of $R_3$. According to this, the film thickness can be increased efficiently and, in addition, it can be prevented that the quantity of the liquid becomes excessive and, therefore, the liquid overflows outside the wiring formation region.

The step of discharging the droplet $L_3$ in the whole wiring formation region can be repeated a plurality of times. According to this, a wiring having the desired film thickness can be produced.

In this case, after each of the discharging steps, a drying treatment is performed in a manner similar to those in the first and second discharging steps, if necessary, in order to remove the dispersion medium. In this case, likewise, the degree of heating or light irradiation may be increased to the extent that not only the dispersion medium is removed, but also the dispersion is converted into a conductive film. However, it is adequate that the dispersion medium can be removed to some extent. The drying treatment can be performed while droplets are discharged in a manner similar to those in the first and second discharging steps.

After drying, the droplet $L_3$ becomes a dry film $S_3$ (not shown in the drawing). The volume of the dry film $S_3$ has been reduced remarkably because of removal of the dispersion medium, the viscosity has been increased and, therefore, it has become easy to fix at a predetermined position in the wiring formation region. Consequently, even when the step of discharging the droplets $L_3$ in the whole wiring formation region is repeated a plurality of times, no bulge is brought about due to mutual attraction between the droplets of individual steps.

Since the portion on which the droplets were dropped earlier has been made to be lyophilic, the droplets $L_3$ do not flow outside the wiring formation region. Consequently, the droplets $L_3$ are likely to remain in the wiring formation region even when discharge is repeated, no bulge is brought about due to mutual attraction, and the line width is not increased.

According to the steps, a dry film layer having the desired thickness can be formed while the line width nearly equivalent to the diameter of the droplet is maintained.

Regarding the dry film after the discharging step, the dispersion medium has to be removed completely in order to improve electrical contact between the fine particles. When a coating material, for example, an organic material, for improving the dispersiveness has been applied on the surface of the conductive fine particle by coating, this coating material has to be removed as well. Consequently, the substrate after the discharging step is subjected to a heat treatment and/or optical treatment.

In general, the heat treatment and/or optical treatment is performed in the air, and if necessary, it can also be performed in an atmosphere of an inert gas, for example, nitrogen, argon, and helium. The treatment temperature of the heat treatment and/or optical treatment is appropriately determined in consideration of the boiling point (vapor pressure) of the dispersion medium, the sort and pressure of the atmospheric gas, the dispersiveness and thermal behaviors, for example, an oxidizing property, of the fine particle, the presence or absence and the quantity of the coating material, the heatproof temperature of the base material, and the like.

For example, in order to remove a coating material made of an organic material, it is necessary to fire at about 300° C. When a substrate of plastic, etc., is used, it is preferable to perform at room temperature or more, but 100° C. or less.

The heat treatment and/or optical treatment can be performed by a treatment with a common hot plate, an electric furnace, etc., and, in addition to them, by lamp annealing. The light source of the light used for the lamp annealing is not specifically limited, and infrared lamps, xenon lamps, YAG lasers, argon lasers, carbon dioxide gas lasers, excimer lasers of XeF, XeCl, XeBr, KrF, KrCl, ArF, ArCl, etc., and the like can be used as the light source. In general, regarding these light sources, those having an output within the range of 10 W or more, but 5,000 W or less are used. However, the range of 100 W or more, but 1,000 W or less is adequate for the present embodiment.

According to the steps, electrical contact between the fine particles is ensured and, therefore, the dry film after the discharging step is converted into a conductive film.

The conductive film formed according to the present embodiment can be formed to have a width nearly equivalent to the diameter of one drop of the dispersion after being hit onto the substrate. Furthermore, by repeating the third discharging step, it is possible to attain the desired film thickness while this line width is maintained. That is, according to the present embodiment, the decrease in the line width and the increase in the film thickness can be achieved without generation of any bulge.

Consequently, according to the present embodiment, a fine, thick conductive film wiring, which provides advantages with respect to the electrical conduction and is unlikely to bring about problems such as breaks and short circuits.

As the second embodiment, a wiring formation apparatus, which is an example of the apparatus for forming a film pattern of the present invention, for carrying out the method for forming a wiring of the first embodiment will be described.

Figure 7:
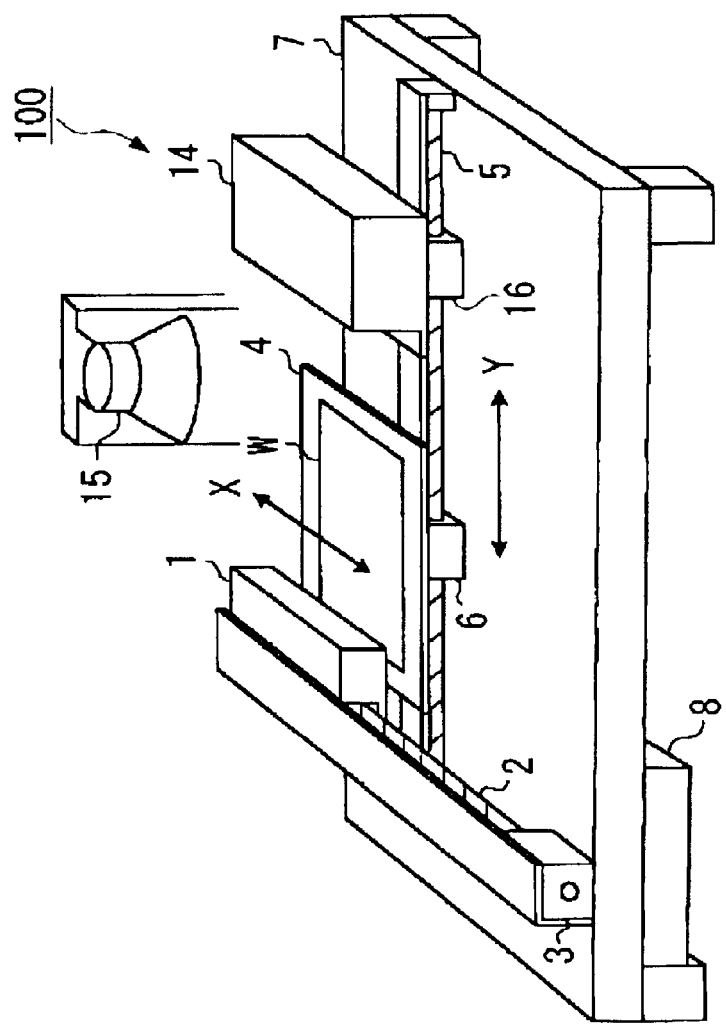
FIG. 7 is a perspective view of an apparatus for forming a film pattern according to the second embodiment.

FIG. 7 is a schematic perspective view of a wiring formation apparatus according to the present embodiment. As shown in FIG. 7, the wiring formation apparatus 100 is provided with an ink-jet head group 1, an X-direction guide axis 2 for driving the ink-jet head group 1 in the X direction, and an X-direction drive motor 3 for rotating the X-direction guide axis 2.

Furthermore, a mounting stage 4 for placing a substrate W, a Y-direction guide axis 5 for driving the mounting stage 4 in the Y direction, and a Y-direction drive motor 6 for rotating the Y-direction guide axis 5 are provided.

In addition, a base stage 7, on which the X-direction guide axis 2 and the Y-direction guide axis 5 are fixed at respective predetermined positions, is provided, and a control device 8 is provided under the base stage 7.

A cleaning mechanism portion 14 and a heater 15 are further provided.

The ink-jet head group 1 is provided with a plurality of ink-jet heads which discharge a dispersion containing conductive fine particles from nozzles (discharge port) and, therefore, apply the dispersion to the substrate with a predetermined interval. The dispersion can be discharged individually from each of the plurality of inkjet heads in accordance with the discharge voltage supplied from the control device 8.

The ink-jet head group 1 is fixed to the X-direction guide axis 2, and the X-direction drive motor 3 is connected to the X-direction guide axis 2. The X-direction drive motor 3 is a stepping motor, etc., and rotates the X-direction guide axis 2 when a drive pulse signal of the X-axis direction is supplied from the control device 8. When the X-direction guide axis 2 is rotated, the ink-jet head group 1 is moved in the X-axis direction relative to the base stage 7.

The mounting stage 4 is to place the substrate W which is applied with the dispersion by this wiring formation apparatus 100, and is provided with a mechanism for fixing this substrate W at a standard position.

The mounting stage 4 is fixed to the Y-direction guide axis 5, and Y-direction drive motors 6 and 16 are connected to the Y-direction guide axis 5. The Y-direction drive motors 6 and 16 are stepping motors, etc., and rotate the Y-axis guide axis 5 when a drive pulse signal of the Y-axis direction is supplied from the control device 8. When the Y-direction guide axis 5 is rotated, the mounting stage 4 is moved in the Y-axis direction relative to the base stage 7.

The cleaning mechanism portion 14 is provided with a mechanism for cleaning the ink-jet head group 1. The cleaning mechanism portion 14 is moved along the Y-direction guide axis 5 by the Y-direction drive motor 16. The movement of the cleaning mechanism portion 14 is also controlled by the control device 8.

Herein, the heater 15 can be a device for heat-treating the substrate W by lamp annealing, which performs vaporization and drying of the discharged liquid onto the substrate and, in addition, which performs a heat treatment for converting into the conductive film. Turning on and turning off of the power of this heater 15 are also controlled by the control device 8.

In the wiring formation apparatus 100 of the present embodiment, in order to discharge the dispersion in a predetermined wiring formation region, a predetermined drive pulse signal is supplied from the control device 8 to the X-direction drive motor 3 and/or the Y-direction drive motor 6, the ink-jet head group 1 and/or mounting stage 4 is moved and, therefore, the ink-jet head group 1 and the substrate W (mounting stage 4) are moved relatively. The discharge voltage is supplied from the control device 8 to a predetermined inkjet head in the ink-jet head group 1 during this relative movement and, therefore, the dispersion is discharged from the ink-jet head.

In the wiring formation apparatus 100 of the present embodiment, the quantity of the droplets discharged from each of the heads of the ink-jet head group 1 can be adjusted by the magnitude of the discharge voltage supplied from the control device 8.

The pitch of the droplets discharged onto the substrate W is determined by a relative movement speed of the inkjet head group 1 and the substrate W (mounting stage 4) and a discharge frequency of the ink-jet head group 1 (frequency of discharge voltage supply).

In the present embodiment, regarding the first and second discharging steps, the dispersion is discharged in the same wiring formation region with the same pitch, and as shown in FIG. 5, the discharge start position of the second discharging step is specified to be the midpoint between the first drop and the second drop in the first discharging step, or the midpoint between the last drop and the next to last drop.

In the third discharging step, the dispersion is discharged in the substantially same wiring formation region as in the first and second discharging steps. Alternatively, the direction of discharge is reversed, and the process is repeated. The pitch thereof is specified to be narrower than that in the first and second discharging steps.

Using the wiring formation apparatus 100 of the present embodiment, it is possible to form the conductive film wiring on the substrate. The width of the wiring is approximately equivalent to the diameter of one drop of the dispersion after being hit onto the substrate. Furthermore, by repeating the third discharging step, it is possible to attain the desired film thickness while this width is maintained. That is, according to the present embodiment, the decrease in the line width and the increase in the film thickness can be achieved without generation of any bulge.

Consequently, according to the present embodiment, a fine, thick conductive film wiring can be formed, which provides advantages with respect to the electrical conduction and is unlikely to bring about problems such as breaks and short circuits.

As the third embodiment, a method for forming a silicon film pattern, which is an example of the method for forming a film pattern of the present invention, will be described. The method for forming a silicon film pattern according to the present embodiment is composed of a surface treatment step, a discharging step, and a heat treatment/optical treatment step. Among them, the discharging step is composed of a solution preparation step, the first discharging step, the second discharging step, and the third discharging step. Each step will be described below.

Various materials, for example, Si wafers, quartz glass, glass, plastic films, and metal plates, can be used as a substrate on which a silicon thin film pattern is to be formed. Those in which semiconductor films, metal films, dielectric films, organic films, etc., are formed as substrate layers on the surfaces of these various material substrates may be used as the substrate on which the silicon thin film pattern is to be formed.

The surface of this substrate on which the silicon thin film pattern is to be formed is subjected to a surface treatment in order that a predetermined contact angle with respect to the liquid containing an organic silicon compound becomes 60 degrees or more, preferably 90 degrees or more, but 110 degrees or less.

Since the method for controlling the liquid-repellent property (wettability) of the surface as described above is similar to that in the first embodiment, explanations thereof are omitted.

Next, liquid containing an organic silicon compound, which is discharged onto the substrate after the surface treatment, will be described.

As the liquid containing an organic silicon compound, the liquid in which the organic silicon compound is dissolved into a solvent is used. The organic silicon compound used here is a silane compound having a ring system represented by a general formula $Si_nX_m$ (where X denotes a hydrogen atom and/or a halogen atom, n denotes an integer of 3 or more, and m denotes an integer of n, 2n−2, 2n, or 2n+2).

Herein, although n is 3 or more, from the viewpoint of thermodynamic stability, solubility, refining ease, etc., n is preferably about 5 to 20 and, in particular, a cyclic silane compound in which n is 5 or 6 is preferable. When less than 5, since the silane compound itself becomes unstable due to warping of the region caused by the ring, it becomes difficult to handle. When n exceeds 20, reduction of solubility resulting from the cohesion force of the silane compound is observed and, therefore, selection of the solvent to be used is limited.

In the general formula $Si_nX_m$ of the silane compound used in the present invention, X is a hydrogen atom and/or a halogen atom. Since these silane compounds are precursor compounds of silicon films, they have to be converted finally into amorphous or polycrystalline silicon by a heat treatment and/or an optical treatment. Silicon-hydrogen bonds and silicon-halogen bonds are cleaved by the treatments, silicon-silicon bonds are newly generated and, therefore, conversion into silicon is brought about finally. As halogen atoms, usually, a fluorine atom, a chlorine atom, a boron atom, and an iodine atom are mentioned, and from the viewpoint of the cleavage of the bond, chlorine and boron are preferable. X may be a hydrogen atom alone or a halogen atom alone, and it may be a partially halogenated silane compound in which the total sum of hydrogen atoms and halogen atoms becomes m.

Regarding these silane compounds, if necessary, compounds which are modified by a group 3 or a group 5 element, for example, boron and phosphorus, can also be used. Preferably, the modified silane compounds contain no carbon atom, and specific examples thereof include modified silane compounds represented by a general formula $Si_aX_bY_c$ (where X denotes a hydrogen atom and/or a halogen atom, Y denotes a boron atom or a phosphorus atom, a denotes an integer of 3 or more, b denotes an integer of a or more, but 2a+c+2 or less, and c denotes an integer of 1 or more, but a or less). Herein, from the viewpoint of thermodynamic stability, solubility, refining ease, etc., the sum of a and c is preferably about 5 to 20 and, in particular, a cyclic silane compound in which the sum is 5 or 6 is preferable. When a+c is less than 5, since the silane compound itself becomes unstable due to warping of the region caused by the ring, it becomes difficult to handle. When a+c exceeds 20, reduction of solubility resulting from the cohesion force of the silane compound is observed and, therefore, selection of the solvent to be used is limited.

In the general formula $Si_aX_bY_c$ of the modified silane compound, X is a hydrogen atom and/or a halogen atom similar to X in the general formula of the non-modified silane compound represented by the $Si_nX_m$, is usually a fluorine atom, chlorine atom, boron atom, and iodine atom, and is preferably chlorine and boron from the viewpoint of the cleavage of the bond. X may be a hydrogen atom alone or a halogen atom alone, and it may be a partially halogenated silane compound in which the total sum of hydrogen atoms and halogen atoms becomes b.

Those having a vapor pressure of 0.001 mmHg or more, but 200 mmHg or less (about 0.133 Pa or more, but 26,600 Pa or less) at room temperature are preferable as the solvent for the liquid containing the organic silicon compound. This is because when the vapor pressure is higher than 200 mmHg, the solvent vaporizes rapidly after being discharged and, therefore, it becomes difficult to form an excellent film.

The vapor pressure of the solvent is more preferably 0.001 mmHg or more, but 50 mmHg or less (about 0.133 Pa or more, but 6,650 Pa or less). This is because when the vapor pressure is higher than 50 mmHg, clogging of a nozzle due to drying is likely to occur during discharge of the droplets by the ink-jet method and, therefore, it becomes difficult to discharge with stability.

On the other hand, when the solvent has a vapor pressure lower than 0.001 mmHg at room temperature, drying becomes slow so that the solvent becomes likely to remain in the film and, therefore, a good-quality conductive film is unlikely to be produced after a heat and/or optical treatment in the later step.

It should be understood that the solvent used is not specifically limited as long as the solvent can dissolve the organic silicon compound and includes examples as follows: hydrocarbon-based solvents such as n-heptane, n-octane, decane, toluene, xylene, cymene, durene, indene, dipentene, tetrahydronaphthalene, decahydronaphthalene, and cyclohexylbenzene; ether-based solvents such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl) ether, and p-dioxane; polar solvents such as propylene carbonate, γ-butyrolactone, N-methyl-2-pyrrolidone, dimethylformamide, dimethyl sulfoxide, and cyclohexanone.

Among these, hydrocarbon-based solvents and ether-based solvents are preferable from the viewpoint of solubility of the organic silicon compound and the stability of the solution, and examples of more preferable solvents can include hydrocarbon-based solvents. These solvents can be used alone or as a mixture of at least two sorts.

When the organic silicon compounds are dissolved in the solvent, the solute concentration is 1% by mass or more, but 80% by mass or less, and can be adjusted in accordance with the desired silicon film thickness. When exceeding 80% by mass, cohesion becomes likely to occur and, therefore, a uniform film is unlikely to be produced.

The surface tension of the solution of the organic silicon compound is preferably within the range of 0.02 N/m or more, but 0.07 N/m or less. This is because when the surface tension is less than 0.02 N/m during discharge of the liquid by the ink-jet method, the wettability of an ink composition with respect to a nozzle surface is increased and, therefore, a deviation in flight is likely to occur, and when exceeding 0.07 N/m, the shape of meniscus at the nozzle tip is not stabilized and, therefore, it becomes difficult to control the quantity of discharge and timing of discharge.

In order to adjust the surface tension, a very small quantity of surface tension regulator of fluorine-based, silicone-based, nonionic, or the like can be added to the solution within the range in which the contact angle with the substrate is not excessively reduced. The nonionic surface tension regulator improves the wettability of the liquid with respect to the substrate, improves the leveling property of the film, and is useful in prevention of occurrence of graininess in the coating film, occurrence of orange peels, etc.

The solution may contain organic compounds, for example, alcohols, ethers, and ketones, if necessary.

The viscosity of the solution is preferably 1 mPa·s or more, but 50 mPa·s or less. This is because when the viscosity is less than 1 mPa·s during discharge by the ink-jet method, the periphery of the nozzle is likely to pollute due to bleeding of ink, and when the viscosity exceeds 50 mPa·s, the frequency of clogging of a nozzle hole is increased and, therefore, it becomes difficult to discharge droplets smoothly.

In a manner similar to that in the first embodiment, the first discharging step through the third discharging step are performed as shown in FIGS. 1 to 4. In general, each discharging step is performed at a temperature equivalent to or more than room temperature, but 100° C. or less. This is because when the temperature is equivalent to or less than room temperature, the solubility of the organic silicon compound is reduced and, therefore, a part thereof may deposit. Preferably, discharge is performed in an atmosphere of an inert gas, for example, nitrogen, helium, and argon. Furthermore, if necessary, a reducing gas, for example, hydrogen, is mixed preferably.

Since the method and the conditions of the drying treatments between individual discharging steps are similar to those in the first embodiment except that it is desirable to perform in an inert gas atmosphere, explanations thereof are omitted.

Regarding the solution after the discharging step, the solvent has to removed and, in addition, the organic silicon compound has to be converted into amorphous or polycrystalline silicon. Consequently, the substrate after the discharging step is subjected to a heat treatment and/or optical treatment.

The heat treatment and/or optical treatment can also be performed in an atmosphere of an inert gas, for example, nitrogen, helium, and argon. The treatment temperature of the heat treatment and/or optical treatment is appropriately determined in consideration of the boiling point (vapor pressure) of the solvent, the sort and pressure of the atmospheric gas, the heatproof temperature of the base material, and the like.

Usually, the treatment is performed in an atmosphere of argon or in argon containing hydrogen at about 100° C. to 800° C., preferably, about 200° C. to 600° C., and more preferably, about 300° C. to 500° C. In general, an amorphous silicon film is produced when the temperature is about 550° C. or less in terms of a temperature reached, and a polycrystalline silicon film is produced when the temperature is equivalent to or more than that. When the temperature reached is less than 300° C., thermal decomposition of the organic silicon compound does not advance adequately and, therefore, sometimes, a silicon film with an adequate thickness cannot be formed. When a polycrystalline silicon film is desired, the amorphous silicon film produced as described above can be converted into the polycrystalline silicon film by laser annealing. Preferably, the laser annealing is performed in an atmosphere of an inert gas, for example, helium and argon, or the inert gas containing a reducing gas, for example, hydrogen.

The heat treatment and/or optical treatment can be performed by a treatment with a common hot plate, an electric furnace, etc., and, in addition to them, by lamp annealing. The light source of the light used for the lamp annealing is not specifically limited, and infrared lamps, xenon lamps, YAG lasers, argon lasers, carbon dioxide gas lasers, excimer lasers of XeF, XeCl, XeBr, KrF, KrCl, ArF, ArCl, and the like can be used as the light source. In general, regarding these light sources, those having an output within the range of 10 W or more, but 5,000 W or less are used. However, the range of 100 W or more, but 1,000 W or less is adequate for the present embodiment.

According to the steps, the solution after the discharging step is converted into an amorphous or polycrystalline silicon film.

The silicon film pattern formed according to the present embodiment can be formed to have a width nearly equivalent to the diameter of one drop of the solution after being hit onto the substrate. Furthermore, by repeating the third discharging step, it is possible to attain the desired film thickness while this line width is maintained. That is, according to the present embodiment, the decrease in the line width and the increase in the film thickness can be achieved without generation of any bulge and, therefore, it becomes possible to form a fine pattern.

Figure 8:
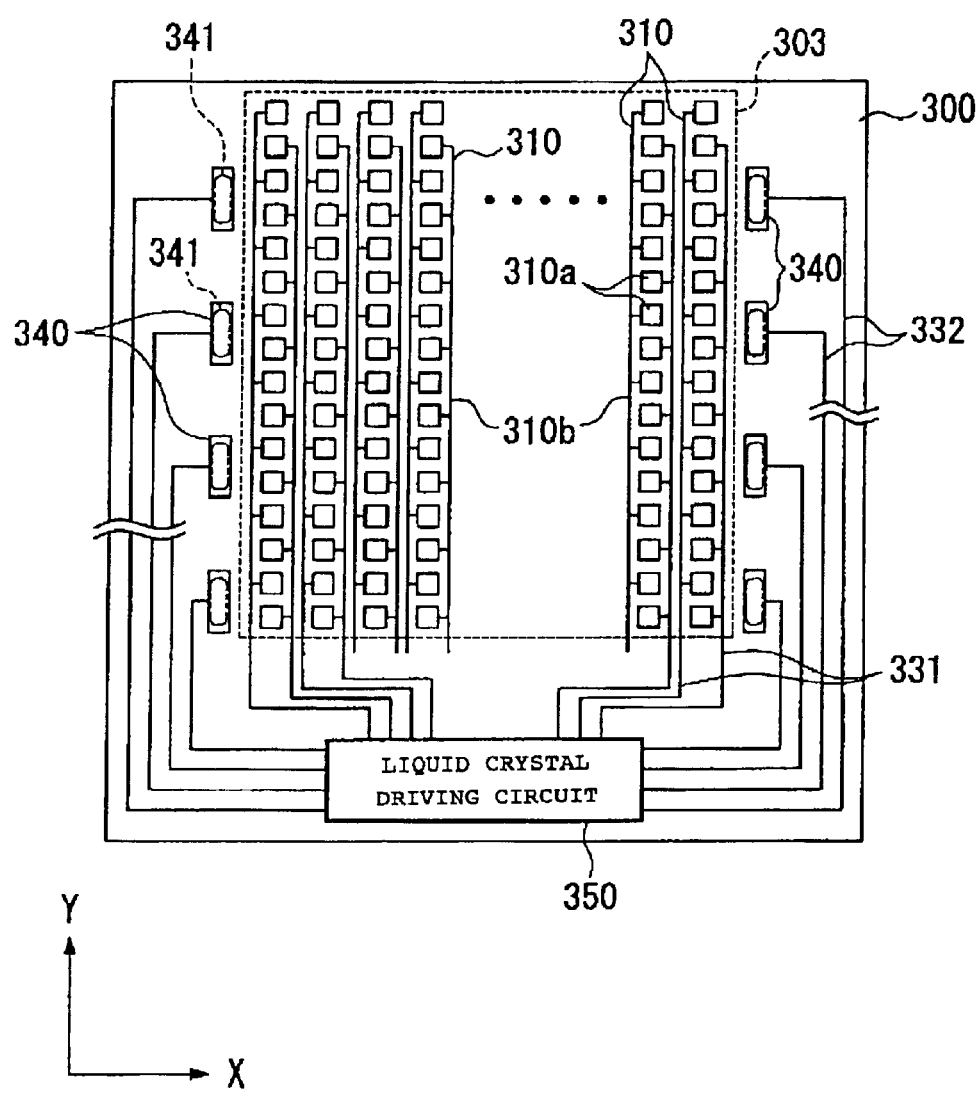
FIG. 8 is a plan view on the first substrate of a liquid crystal device according to the fourth embodiment.

As the fourth embodiment, a liquid crystal device, which is an example of the electro-optic apparatus of the present invention, will be described. FIG. 8 is a diagram showing a two-dimensional layout of signal electrodes, etc., on a first substrate of the liquid crystal device according to the present embodiment. The liquid crystal device according to the present embodiment is roughly composed of this first substrate, a second substrate (not shown in the drawing) provided with scanning electrodes, etc., and a liquid crystal (not shown in the drawing) injected between the first substrate and the second substrate.

As shown in FIG. 8, a plurality of signal electrodes 310 . . . are installed in the shape of a multiplex matrix in a pixel region 303 on the first substrate 300. In particular, each of the signal electrodes 310 . . . is composed of a plurality of pixel electrode portions 310*a* . . . installed corresponding to individual pixels and signal wirings 310*b* . . . connecting these in the shape of a multiplex matrix, and is extended in the Y direction.

Reference numeral 350 denotes a liquid crystal driving circuit having a one-chip structure, and this liquid crystal driving circuit 350 and one end side (the lower side in the drawing) of each of the signal wirings 310*b* . . . are connected via first routing wirings 331 . . . .

Reference numerals 340 . . . denote vertical conduction terminals, and these vertical conduction terminals 340 . . . and terminals installed on the second substrate, although not shown in the drawing, are connected via vertical conduction materials 341 . . . . The vertical conduction terminals 340 . . . and the liquid crystal driving circuit 350 are connected via second routing wirings 332 . . . .

In the present embodiment, each of the signal wirings 310*b* . . . , the first routing wirings 331 . . . , and the second routing wirings 332 . . . installed on the first substrate 300 is formed using the wiring formation apparatus according to the second embodiment by the method for forming a wiring according to the first embodiment.

Using the liquid crystal device of the present embodiment, a liquid crystal device in which problems such as breaks and short circuits in the individual wirings, are unlikely to bring about and which can be miniaturized and slimmed, can be produced.

Figure 9:
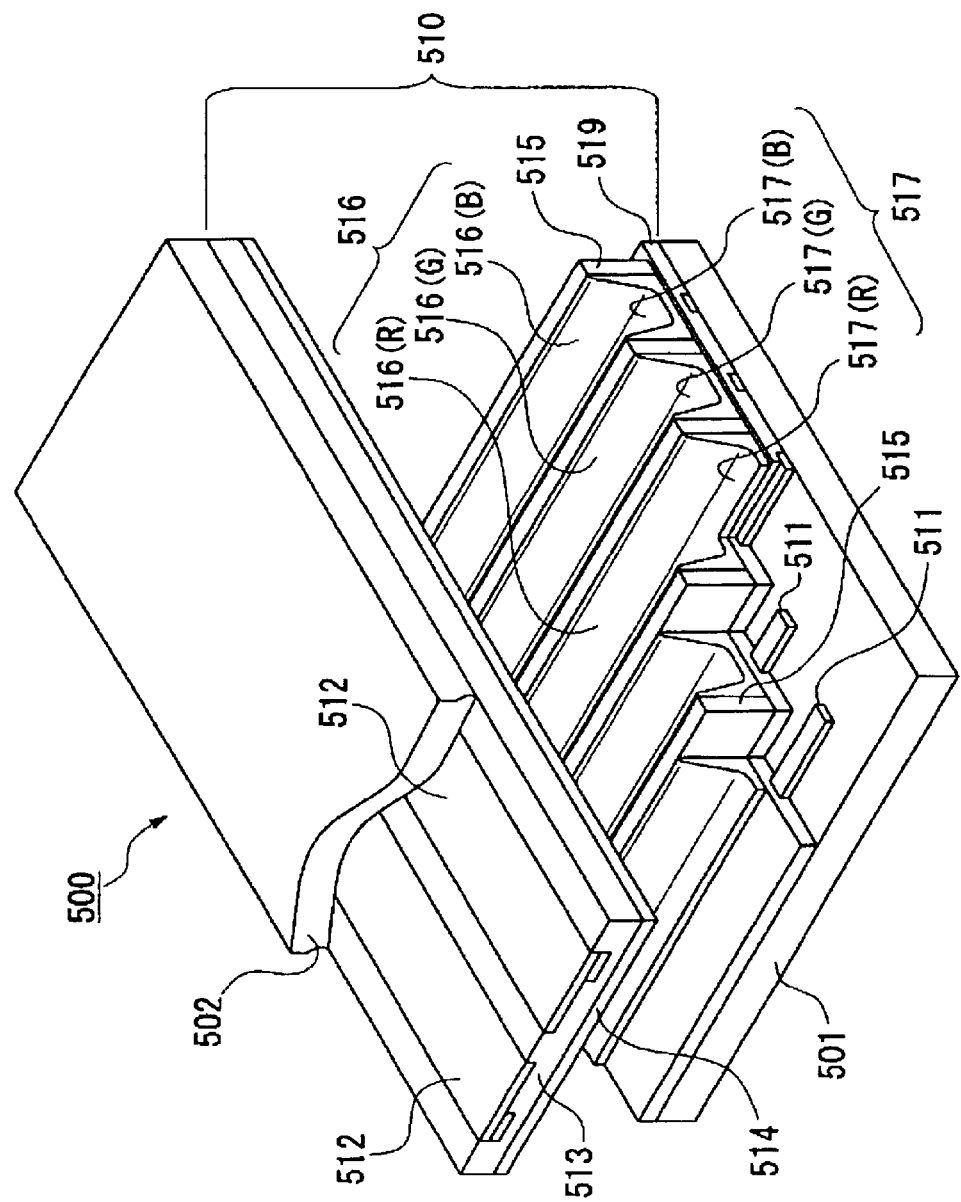
FIG. 9 is an exploded perspective view of a plasma display device according to the fifth embodiment.

As the fifth embodiment, a plasma display device, which is an example of the electro-optic apparatus of the present invention, will be described. FIG. 9 is an exploded perspective view showing a plasma display device 500 according to the present embodiment.

The plasma display device 500 according to the present embodiment is roughly composed of a glass substrate 501 and a glass substrate 502 placed facing each other, and an electric discharge display 510 formed therebetween.

The electric discharge display 510 is composed of an assembly of a plurality of electric discharge chambers 516, and among the plurality of electric discharge chambers 516, three electric discharge chambers 516 of a red electric discharge chamber 516(R), a green electric discharge chamber 516(G), and a blue electric discharge chamber 516(B) make a group, and are placed in order to constitute one pixel.

Address electrodes 511 are formed in the shape of stripes at a predetermined interval on the upper surface of the (glass) substrate 501. A dielectric layer 519 is formed in order to cover those address electrodes 511 and the upper surface of the substrate 501. Partition walls 515 are formed between address electrodes 511 on the dielectric layer 519. Regarding the partition walls 515, partitions having a predetermined spacing (not shown in the drawing) are also installed in the direction orthogonal to the address electrodes 511 at predetermined positions in the longitudinal direction thereof and, therefore, rectangular regions partitioned basically by partition walls adjacent to both the right and left sides in the width direction of the address electrodes 511 and the partition walls installed extending in the direction orthogonal to the address electrodes 511 are formed. The electric discharge chambers 516 are formed in order to correspond to these rectangular regions, and three rectangular regions are formed into a single group, making one pixel. Fluorophors 517 are placed inside the rectangular regions partitioned by the partition walls 515. The fluorophor 517 emits any one of red, green, and blue fluorescence, and a red fluorophor 517 (R) is placed on the bottom portion of the red electric discharge chamber 516(R), a green fluorophor 517(G) is placed on the bottom portion of the green electric discharge chamber 516(G), and a blue fluorophor 517(B) is placed on the bottom portion of the blue electric discharge chamber 516(B).

On the glass substrate 502 side, a plurality of display electrodes 512 are formed in the shape of stripes at a predetermined interval in the direction orthogonal to the address electrodes 511, a dielectric layer 513 is formed covering them and, furthermore, a protection film 514 made of MgO, etc., is formed.

The substrate 501 and glass substrate 502 are faced each other in order that the address electrodes 511 . . . and the display electrodes 512 . . . become orthogonal to each other, and are adhered with each other. The space portion enclosed by the substrate 501, the partition walls 515, and the protection film 514 formed on the glass substrate 502 side is evacuated and is filled with a noble gas so as to form the electric discharge chamber 516. The display electrodes 512 formed on the glass substrate 502 side are formed in order that two display electrodes 512 are placed on an electric discharge chamber 516 basis.

The address electrodes 511 and the display electrodes 512 are connected to an alternator, although not shown in the drawing, individual electrodes are energized and, therefore, the fluorophors 517 at the required positions in the electric discharge display 510 are made to excite and emit, so that color display can be performed.

In the present embodiment, the address electrodes 511 and display electrodes 512 are formed individually using the wiring formation apparatus according to the second embodiment by the method for forming a wiring according to the first embodiment.

Using the liquid crystal device of the present embodiment, a plasma display device in which problems such as breaks and short circuits in the individual electrodes, are unlikely to bring about and, in addition, which can be miniaturized and slimmed, can be produced.

As the sixth embodiment, a specific examples of electronic device of the present invention will be described. FIG. 10(a) is a perspective view showing an example of a cellular phone. In FIG. 10(a), reference numeral 600 denotes a cellular phone main body, and reference numeral 601 denotes a liquid crystal display provided with the liquid crystal device of the fourth embodiment.

FIG. 10(b) is a perspective view showing an example of portable information processing device, for example, word processors and personal computers. In FIG. 10(b), reference numeral 700 denotes information processing device, reference numeral 701 denotes an input portion, for example, a keyboard, reference numeral 703 denotes an information processing main body, and reference numeral 702 denotes a liquid crystal display provided with the liquid crystal device of the fourth embodiment.

FIG. 10(c) is a perspective view showing an example of wristwatch type electronic device. In FIG. 10(c), reference numeral 800 denotes a watch main body, and reference numeral 801 denotes a liquid crystal display provided with the liquid crystal device of the fourth embodiment.

Since the electronic device shown in FIGS. 10(a) to (c) is provided with the liquid crystal device of the embodiment, problems such as breaks and short circuits in the wirings are unlikely to bring about and, in addition, it becomes possible to miniaturize and to slim. Although the electronic device of the present embodiment was specified to include the liquid crystal device, it should be understood that the electronic device can be provided with other electro-optic devices, for example, an organic electroluminescent display device and a plasma display device.

Figure 11:
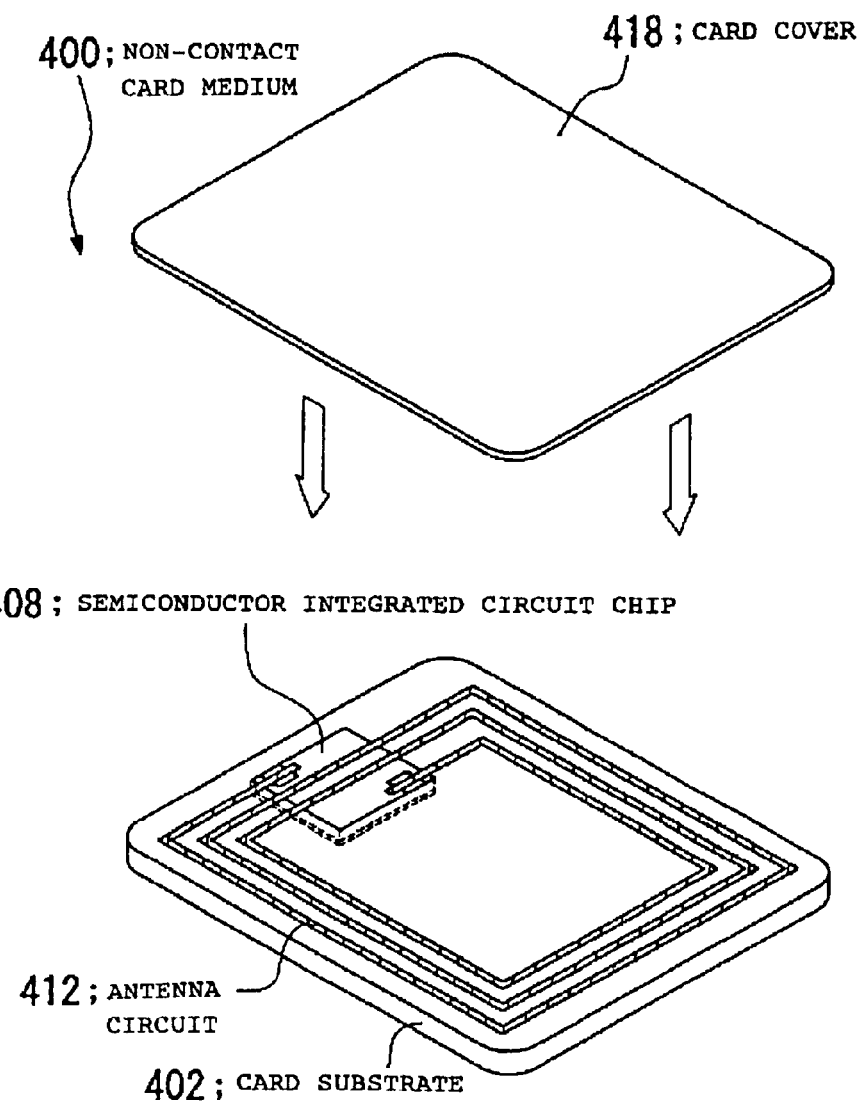
FIG. 11 is an exploded perspective view of a non-contact card medium according to the seventh embodiment.
Figure 1:
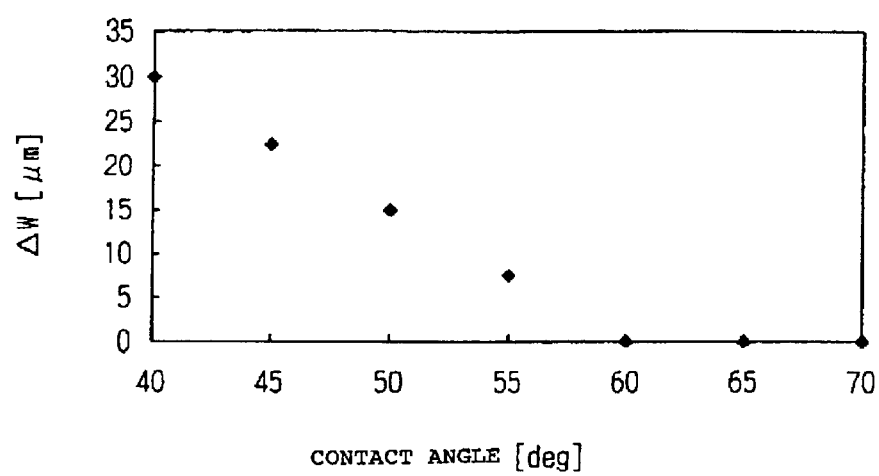
Figure 13:
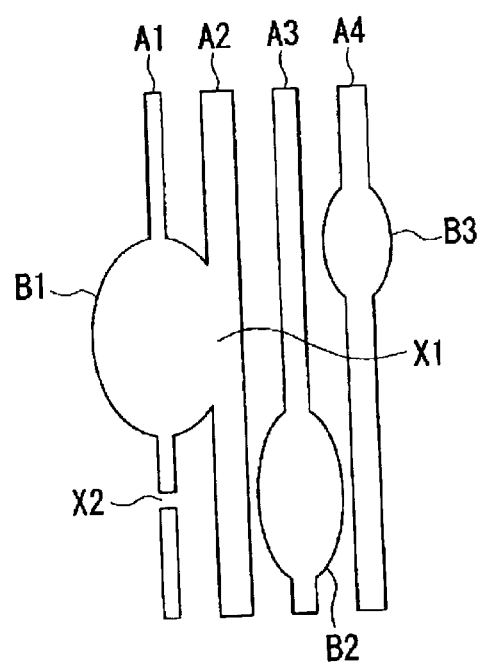
FIG. 13 is a diagram for illustrating the relationship between the bulge and the break and short circuit.

As the seventh embodiment, an embodiment of a non-contact card medium of the present invention will be described. The non-contact card medium according to the present embodiment is shown in FIG. 11. The non-contact card medium 400 according to the present embodiment has a semiconductor integrated circuit chip 408 and an antenna circuit 412 built into a case composed of a card substrate 402 and a card cover 418, and performs at least one of power supply and data transmission and reception with an external transmitter receiver, although not shown in the drawing, by at least one of electromagnetic wave and capacitance coupling.

In the present embodiment, the antenna circuit 412 is formed using the wiring formation apparatus according to the second embodiment by the method for forming a wiring according to the first embodiment.

Using the non-contact card medium of the present embodiment, a non-contact card medium in which problems such as breaks and short circuits in the antenna circuit 412 are unlikely to bring about, and which can be miniaturized and slimmed, can be produced.

In a first example, Xylene was added to a gold fine particle dispersion (manufactured by VACUUM METALLURGICAL CO., LTD., brand name "Perfect Gold") in which gold fine particles having a diameter of 10 mm were dispersed in toluene. The resulting liquid having a viscosity of 8 cp and a surface tension of 24 N/m was discharged with a predetermined pitch by an ink-jet apparatus and, therefore, a conductive film line was formed.

As an ink-jet head, a head of a commercially available printer (brand name "MJ930C") was used. However, since the ink suction portion was made of plastic, the suction portion was changed to a jig made of metal in order to prevent dissolution into an organic solvent, and was subjected to use. The relative movement speed of the substrate and the ink-jet head was specified to be constant, and change of the pitch was performed by adjusting only the discharge frequency.

A polyimide film subjected to tetrafluoroethylene processing was adhered to a glass substrate and was used as a substrate. The contact angle of the gold fine particle dispersion was about 60 degrees with respect to this substrate.

Discharge was performed using only one nozzle, and discharge was performed at a discharge voltage of 15 V through all discharging steps. At that time, the diameter of the droplet after being hit onto the substrate was about 55 $\mu$m.

As the first discharging step, droplets were discharged in a line with a pitch of 70 $\mu$m and a distance between droplets of 15 $\mu$m in order that the droplets did not join to each other. Subsequently, a drying step was performed at 100° C. for 5 minutes by the use of a dryer.

As the second discharging step, droplets were discharged in a line with a pitch of 70 $\mu$m and a distance between droplets of 15 $\mu$m similar to those in the first discharging step. The droplets discharged in the second discharging step were discharged in order to hit at nearly the midpoint between the discharged liquid in the first discharging step. Subsequently, a drying step was performed at 100° C. for 5 minutes by the use of a dryer. According to this, a line having no break between droplets was formed.

As the third discharging step, a step of discharging on the line formed in the first and second discharging steps with a pitch of 30 $\mu$m and an overlap between droplets of 25 $\mu$m was repeated three times while a drying step was performed at 100° C. for 5 minutes between individual discharging steps. As a result, the line width was not increased by recoating, and a line having an excellent shape was produced while the line width of 55 μm, that was the same as the diameter of the droplet, was maintained.

The resulting line was fired at 300° C. for 30 minutes and, therefore, a gold line having gold luster was produced. The film thickness was 1 μm, and the resistivity was $5 \times 10^{-6}$ Ωcm.

In a second example, silver fine particle dispersion was discharged onto a substrate by ink jet. The silver fine particle dispersion was prepared as described below. 90 mg of silver nitrate was dissolved into 500 mL of water, and was heated to 100° C. Furthermore, 10 mL of 1% concentration sodium citrate aqueous solution was added while being agitated and was boiled for 80 minutes without being processed. According to this, a liquid in which silver colloid, the periphery thereof being covered with citric acid for preventing agglomeration, was dispersed in the aqueous solution was produced. The average particle diameter of this silver colloid was 30 nm. After this liquid was concentrated by centrifugal separation, water and a surface tension regulator were added again to convert into ink, the viscosity was adjusted to be 2 cp and the surface tension was adjusted to be 28 N/m and, therefore, it became possible to discharge by an ink-jet head.

The silver fine particle dispersion thus adjusted was discharged from an ink jet head of the same printer of Example 1, and a conductive film line was formed.

A polyimide film subjected to tetrafluoroethylene processing was used as a substrate similarly to Example 1. The contact angle of the silver fine particle dispersion was about 90 degrees with respect to the film.

Discharge was performed using only one nozzle, and discharge was performed at a discharge voltage of 15 V through all discharging steps. At that time, the diameter of the droplet after being hit onto the substrate was about 40 μm.

As the first discharging step, droplets were discharged in a line with a pitch of 50 μm and a distance between droplets of 10 μm in order that the droplets did not join to each other. Subsequently, a drying step was performed at 100° C. for 5 minutes by the use of a dryer.

As the second discharging step, droplets were discharged in a line with a pitch of 50 μm and a distance between droplets of 10 μm similarly to those in the first discharging step. The droplets discharged in the second discharging step were discharged in order to hit at nearly the midpoint between the discharged liquid in the first discharging step. Subsequently, a drying step was performed at 100° C. for 5 minutes by the use of a dryer. According to this, a line having no break between droplets was formed.

As the third discharging step, a step of discharging on the line formed in the first and second discharging steps with a pitch of 20 μm and an overlap between droplets of 20 μm was repeated three times while a drying step was performed at 100° C. for 5 minutes between individual discharging steps. As a result, the line width was not increased on a recoating basis, and a line having an excellent shape was produced while the line width of 40 μm, that was the same as the diameter of the droplet, was maintained. The resulting line was fired at 300° C. for 30 minutes and, therefore, a silver line having silver luster was produced. The film thickness was 1.5 μm, and the resistivity was $4 \times 10^{-6}$ Ωcm.

In a third example, line formation was performed using the same gold fine particle dispersion and ink-jet head as those in Example 1. A commercially available slide glass subjected to a treatment for imparting liquid repellency by a plasma polymerization treatment was used as a substrate. The contact angle of the gold fine particle dispersion was about 40 degrees with respect to this substrate.

Discharge was performed using only one nozzle, and discharge was performed at a discharge voltage of 15 V through all discharging steps. At that time, the diameter of the droplet after being hit onto the substrate was about 65 μm.

As the first discharging step, droplets were discharged in a line with a pitch of 75 μm and a distance between droplets of 10 μm in order that the droplets did not join to each other. Subsequently, a drying step was performed at 100° C. for 5 minutes by the use of a dryer.

As the second discharging step, droplets were discharged in a line with a pitch of 75 μm and a distance between droplets of 10 μm similarly to those in the first discharging step. The droplets discharged in the second discharging step were discharged in order to hit at nearly the midpoint between the discharged liquid in the first discharging step. Subsequently, a drying step was performed at 100° C. for 5 minutes by the use of a dryer. According to this, a line having no break between droplets was formed.

As the third discharging step, a step of discharging on the line formed in the first and second discharging steps with a pitch of 40 μm and an overlap between droplets of 25 μm was repeated three times while a drying step was performed at 100° C. for 5 minutes between individual discharging steps. As a result, although no bulge was generated, the line width was increased on a recoating basis and, finally, the line width was increased to 105 μm. The reason for this is considered that impartation of liquid repellency to the substrate was inadequate.

Line formation was performed using the same silver fine particle dispersion, ink-jet head, and substrate as those in Example 2.

Discharge was performed using only one nozzle, and the first discharging step was performed at a discharge voltage of 15 V in such a manner that there was no interval between the droplets discharged and, therefore, droplets overlapped each other from the beginning. That is, discharge was performed with a pitch of 35 μm in order that the overlap between droplets became 5 μm. The result was little more than that large droplets made by gathering of a plurality of droplets were formed at a certain interval. That is, no lines were formed.

Consequently, it was verified that under the condition of high liquid repellency, such as the contact angle of 90 [deg], as in Example 2, an excellent wiring was not able to form unless the method for formation according to the present invention was adopted.

In a fourth example, line formation was performed using the same gold fine particle dispersion and ink-jet head as those in Example 1. A commercially available slide glass subjected to a treatment for imparting liquid repellency by a plasma polymerization treatment and, thereafter, subjected to a treatment for imparting lyophilic by irradiating ultraviolet light having a wavelength of 172 nm at 10 mW/cm$^2$ was used as a substrate. The degree of lyophilic and liquid repellency of the substrate was adjusted by changing the length of the irradiation time of ultraviolet light and, therefore, a plurality of substrates having different contact angles of the gold fine particle dispersion as shown in Table 1 were produced. Subsequently, lines were formed thereon individually.

Discharge was performed using only one nozzle, and discharge was performed at a discharge voltage of 15 V through all discharging steps. At that time, the diameter R of the droplet after being hit onto the substrate was as shown in Table 1.

Regarding every substrate, as the first discharging step, droplets were discharged in a line with a pitch that brought about a distance between droplets of 10 µm in order that the droplets did not join to each other. Subsequently, a drying step was performed at 100° C. for 5 minutes by the use of a dryer.

As the second discharging step, droplets were discharged in a line with a distance between droplets of 10 µm similarly to that in the first discharging step. The droplets discharged in the second discharging step were discharged in order to hit at nearly the midpoint between the discharged liquid in the first discharging step. Subsequently, a drying step was performed at 100° C. for 5 minutes by the use of a dryer. According to this, a line having no break between droplets was formed. The line width W2 at this time was as shown in Table 1.

Regarding every substrate, as the third discharging step, a step of discharging on the line formed in the first and second discharging steps with a pitch that brought about an overlap between droplets of 20 µm was repeated three times while a drying step was performed at 100° C. for 5 minutes between individual discharging steps. The line width W5 at this time was as shown in Table 1.

As a result, it was observed that as shown in Table 1 and FIG. 12, when the contact angle were 60 to 70 degrees, the difference ΔW between W2 and W5 were 0 µm, and when the contact angle became smaller than 60 degrees, the ΔW became larger. Consequently, it was verified that the contact angle had to be 60 degrees or more.

TABLE 1

|  | Contact angle [deg] | R [µm] | W5 [µm] | ΔW [µm] | W2 [µm] |
| --- | --- | --- | --- | --- | --- |
| Example 4-1 | 70 | 49 | 49 | 49 | 0 |
| Example 4-2 | 65 | 52 | 52 | 52 | 0 |
| Example 4-3 | 60 | 55 | 55 | 55 | 0 |
| Example 4-4 | 55 | 57 | 57 | 64 | 7 |
| Example 4-5 | 50 | 60 | 60 | 75 | 15 |
| Example 4-6 | 45 | 62 | 62 | 84 | 22 |
| Example 4-7 | 40 | 65 | 65 | 95 | 30 |

As described above, according to the method for forming a film pattern of the present invention, since the risk of generation of the bulge is reduced, the liquid repellency of the substrate can be increased, and the contact angle between the substrate and the liquid can be increased. Consequently, it becomes possible to decrease the line width and increase the film thickness. Since the ink-jet method is used, the film can be formed even when the substrate is not flat and has concavities and convexities. Consequently, for example, the film of wiring, etc., can also be formed traddling uneven portions.

According to the apparatus for forming a film pattern of the present invention, an apparatus for forming a film pattern can be produced, in which an increase in film thickness is achieved efficiently with simple steps, a requirement for a decrease in line width is met and, in addition, problems such as breaks and short circuits are not brought about when a conductive film is made.

According to the conductive film wiring of the present invention, a fine, thick conductive film wiring can be formed, which provides advantages with respect to the electrical conduction and is unlikely to bring about problems such as breaks and short circuits.

According to the invention, an electro-optical apparatus can be provided, in which problems such as breaks and short circuits in the wirings and the antenna are unlikely to bring about and, in addition, which can be miniaturized and slimmed, and electronic device and a non-contact card medium using the electro-optical apparatus can be provided.

What is claimed is:

1. A method of forming a film, the method comprising:
   disposing a plurality of first droplets of a liquid material on a substrate with a first pitch larger than diameter of the first droplets after being disposed on the substrate; and
   disposing a plurality of second droplets of the liquid material on the substrate with a second pitch larger than diameters of the second droplets after being disposed on the substrate.

2. The method for forming according to claim 1, the first pitch being nearly equal to the second pitch.

3. The method for forming a film according to claim 1, the first pitch being twice or less than the diameters of the first droplets after being disposed on the substrate.

4. The method for forming a film according to claim 1, the first pitch being larger than the diameters of the first droplets after being disposed on the substrate by 10 µm or more.

5. The method for forming a film according to claim 1, further comprising:
   disposing a plurality of third droplets of the liquid material on the substrate.

6. The method for forming a film according to claim 5, the plurality of the third droplets being disposed with a third pitch, the third pitch being equal to or less than the diameters of the third droplets after being disposed on the substrate.

7. A method of forming a film, the method comprising:
   disposing a plurality of first droplets on a substrate such that there is a first space between two adjacent droplets of the plurality of first droplets by discharging a liquid material; and
   disposing a plurality of second droplets on the substrate such that there is a second space between two adjacent droplets of the plurality of second droplets by discharging the liquid material.

8. The method for forming a film according to claim 7, further comprising:
   disposing a plurality of third droplets such that there is a third space between adjacent droplets of the plurality of third droplets by discharging the liquid material.

9. The method of forming a film according to claim 8, the plurality of third droplets being disposed in a predetermined film formation region and the region being filled with at least the first and the second droplets.

10. A method of forming a film, the method comprising:
    disposing a plurality of first droplets on a substrate such that there is a first space between two adjacent droplets of the plurality of first droplets by discharging a liquid material; and
    disposing a plurality of second droplets such that there is a second space between two adjacent droplets of the plurality of second droplets by discharging the liquid material, one of outlines of the second droplets crossing one of outlines of the first droplets.

11. The method for forming a film according to claim 10, the substrate being surface-treated.

12. The method for forming a film according to claim 11, a contact angle of the first or the second droplet with the substrate is 60 degrees of more.

13. The method for forming a film according to claim 12, the liquid material for forming a film including a conductive material.

14. The method for forming a film according to claim 13, further comprising:

converting the liquid material for forming a film into a conductive film by at least one of a heat treatment and an optical treatment before disposing a plurality of second droplets.

15. An apparatus for forming a film pattern, which forms the film pattern by discharging a liquid material on a substrate by an ink-jet method, the apparatus comprising:

an ink-jet head; and the film pattern being formed using the ink-jet head by the method for forming a film according to claim 10.

16. An electro-optical apparatus comprising the conductive film wiring according to claim 10.

17. Electronic equipment comprising the electro-optical apparatus according to claim 16.

18. A non-contact card medium comprising the conductive film wiring according to claim 10 as an antenna circuit.

* * * * *